(12) United States Patent
Thalmann

(10) Patent No.: US 7,254,758 B2
(45) Date of Patent: Aug. 7, 2007

(54) METHOD AND APPARATUS FOR TESTING CIRCUIT UNITS TO BE TESTED WITH DIFFERENT TEST MODE DATA SETS

(75) Inventor: Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 11/034,236

(22) Filed: Jan. 12, 2005

(65) Prior Publication Data
US 2005/0190629 A1 Sep. 1, 2005

(30) Foreign Application Priority Data
Jan. 12, 2004 (DE) .............. 10 2004 001 653

(51) Int. Cl.
G11C 29/00 (2006.01)
G01R 31/28 (2006.01)
(52) U.S. Cl. .................. 714/718; 714/734
(58) Field of Classification Search ............. None
See application file for complete search history.

(56) References Cited
U.S. PATENT DOCUMENTS 5,034,923 A * 7/1991 Kuo et al. ............ 365/189.01
5,305,267 A * 4/1994 Haraguchi et al. ........ 365/201
6,865,707 B2   3/2005 Ernst et al.
6,967,878 B2 * 11/2005 Dono ................... 365/200
2002/0157052 A1  10/2002 Ernst et al.
2005/0071712 A1   3/2005 Thalmann

FOREIGN PATENT DOCUMENTS

DE   101 15 879 C1   10/2002
DE   102 23 167 A1   12/2003

* cited by examiner

Primary Examiner—Christine T. Tu
(74) Attorney, Agent, or Firm—Maginot, Moore & Beck

(57) ABSTRACT

The invention provides a test apparatus for testing a circuit unit to be tested. In one embodiment, a circuit unit incorporating aspects of the invention includes a data memory bank (106) for storing test mode data which are fed via an address control terminal (201) and with which the circuit unit (101) to be tested can be tested, provision being made of at least one test mode bank (104a-104n) for providing at least one test mode data set (204a-204n) and at least one activation signal (205a-205n), at least one register bank (103a-103n) and a transfer device for transferring a test mode data set (204a-204n) from a register bank (103a-103n) to the data memory bank (106) in a manner dependent on the activation signal (205a-205n).

19 Claims, 2 Drawing Sheets

METHOD AND APPARATUS FOR TESTING CIRCUIT UNITS TO BE TESTED WITH DIFFERENT TEST MODE DATA SETS

CROSS-REFERENCE TO RELATED APPLICATIONS

This application claims priority to German Patent Application no. 10 2004 001 653.4, filed Jan. 12, 2004.

FIELD OF THE INVENTION

The present invention relates generally to test arrangements for testing electronic circuit units, in particular memory chips, and relates in particular to a test apparatus for testing a circuit unit to be tested.

BACKGROUND

Circuit units to be tested, in particular memory chips have internal registers for storing test topologies. Different topologies are necessary in order to simulate "worst case" conditions in a memory array. Registers of this type store test topologies which are used in a subsequent circuit test of the circuit unit to be tested.

It is usually the case that different test topologies are used for testing a circuit unit to be tested, so that it is necessary to change over between different test topologies. In order to change over between different test topologies, it has been proposed:
(i) in each case to reload the content of a register by means of a test mode, or
(ii) to change over between different registers.

The abovementioned concept (i) has the advantage that only one register is required, but has the disadvantage that a pattern sequence (test pattern sequence) has to be interrupted when the register content is being reloaded.

The abovementioned concept (ii) has the advantage that it is possible to switch over during the run time of a test mode, i.e. "on the fly", but is associated with the disadvantage that it is necessary to use additional external terminal pins for addressing the registers. Furthermore, the disadvantage arises that continual reloading of registers takes up a greater deal of test time such that test costs have increased.

The test costs when testing circuit units to be tested result from the number of circuit units to be tested which can be tested in a specific time, i.e. as a result of the throughput rate. In order to lower test costs, it is possible either to reduce the test times or to increase the number of circuit units to be tested which can be tested in parallel in a test apparatus.

FIG. 2 shows elements of a circuit unit to be tested in a schematic block diagram. A data register R contains various memory units YA, YB, XWR and XRD, four memory units usually being used in the prior art.

These memory units are activated by means of a test mode and in each case loaded with a specific register content. The activation of the test mode and the transfer of the register content are carried out by means of an address and control line A/K, test mode data being input at a test mode data terminal T.

The loading—shown in FIG. 2—of test mode data into a data register R of the circuit unit to be tested has the essential disadvantage that the individual registers YA, YB, XWR and XRD can only be loaded sequentially with the corresponding register contents since, in a register drive unit A, a test mode unit TM can only drive individual register drive units Y1, Y2, X1 and X2 sequentially. The test times and thus the test costs increase in this way since the test mode data for different test topologies always have to be newly loaded sequentially into the data register R.

Therefore, it is an object of the present invention to develop a test apparatus in such a way that a test time when testing circuit units to be tested is reduced.

An essential concept of the invention consists in providing, besides a data register, additional register banks (at least two) in which test mode data sets can be stored beforehand. In the event of a changeover of test topologies, it is then merely necessary for a complete test mode data set to be transferred in parallel from the at least one additional register bank into the data register.

SUMMARY

The present invention is directed to a circuit unit including a data register bank for storing a test mode data set. Thus, in accordance with one embodiment of the present invention, a circuit unit may be provided with, besides a data register, an additional register bank in which test mode data sets can be stored beforehand. In the event of a changeover of test topologies, it is then merely necessary for a complete test mode data set to be transferred in parallel from the at least one additional register bank into the data register.

Consequently, the invention affords the advantage that a waiting time which occurs during a sequential reloading of memory units in the data register is obviated.

A further advantage of the method according to the invention and of the test apparatus according to the invention consists in the fact that, when a plurality of register banks are used, the effect achieved is that all the memory units of a data register can be unloaded with the aid of a single test mode call with different test mode data.

In particular when memory units of the data register have to be multiply reloaded during a testing of the circuit unit to be tested, this can be effected in accordance with the method according to the invention by means of a call of different register banks, only a single test mode call being necessary in each case.

One embodiment of a circuit unit incorporating a test apparatus according to the invention for testing a circuit unit to be tested has:

a) an address control terminal, via which test mode data, for example in the form of test mode data sets, provided in the test apparatus can be fed to the circuit unit to be tested; and b) a data memory bank, which has a number m of data memory units, for storing the test mode data which is fed via the address control terminal and with which the circuit unit to be tested can be tested, the circuit unit to be tested furthermore having at least one test mode bank for providing at least one test mode data set and at least one activation signal, at least one register bank, the register bank being fed in each case a test mode data set and in each case an activation signal, and a transfer device for transferring a test mode data set from a register bank to the data memory bank in a manner dependent on the activation signal.

Furthermore, one embodiment of a test method according to the invention for testing a circuit unit to be tested has the following steps:

a) feeding of test mode data, which are provided in the test apparatus, to the circuit unit to be tested via an address control terminal; and b) storage of the test mode data which are fed via the address control terminal, and with which the circuit unit to be tested is tested, in a data memory bank having a number m of data memory units,
c) at least one test mode data set and at least one activation signal being provided by means of at least one test mode bank;
d) in each case a test mode data set and in each case an activation signal being fed to at least one register bank provided in the circuit unit to be tested; and
e) in each case a test mode data set is transferred from a register bank to the data memory bank in a manner dependent on the activation signal by means of a transfer device.

Advantageous developments and improvements of the respective subject matter of the invention are found in the subclaims.

In accordance with one preferred development of the present invention, the at least one register bank in each case has a number m of register units corresponding to the number m of data memory units.

In accordance with a further preferred development of the present invention, the transfer device comprises a number m of transfer lines corresponding to the number m of data memory units.

In accordance with yet another preferred development of the present invention, provision is made of a test mode bank for providing at least one test mode data set and at least one activation signal for each of a number of n register banks.

In accordance with yet another preferred development of the present invention, a test mode data set is transferred from register units of a register bank in parallel to the data memory units of the data memory bank.

In accordance with yet another preferred development of the present invention, a test mode data set is transferred from register units of a register bank to the data memory units of the data memory bank after an activation signal has been fed to the corresponding register bank.

Exemplary embodiments of the invention are illustrated in the drawings and are explained in more detail in the description below.

BRIEF DESCRIPTION OF THE DRAWINGS

In the drawings.

In the figures, identical reference symbols designate identical or functionally identical components or steps.

DETAILED DESCRIPTION

Figure 1:
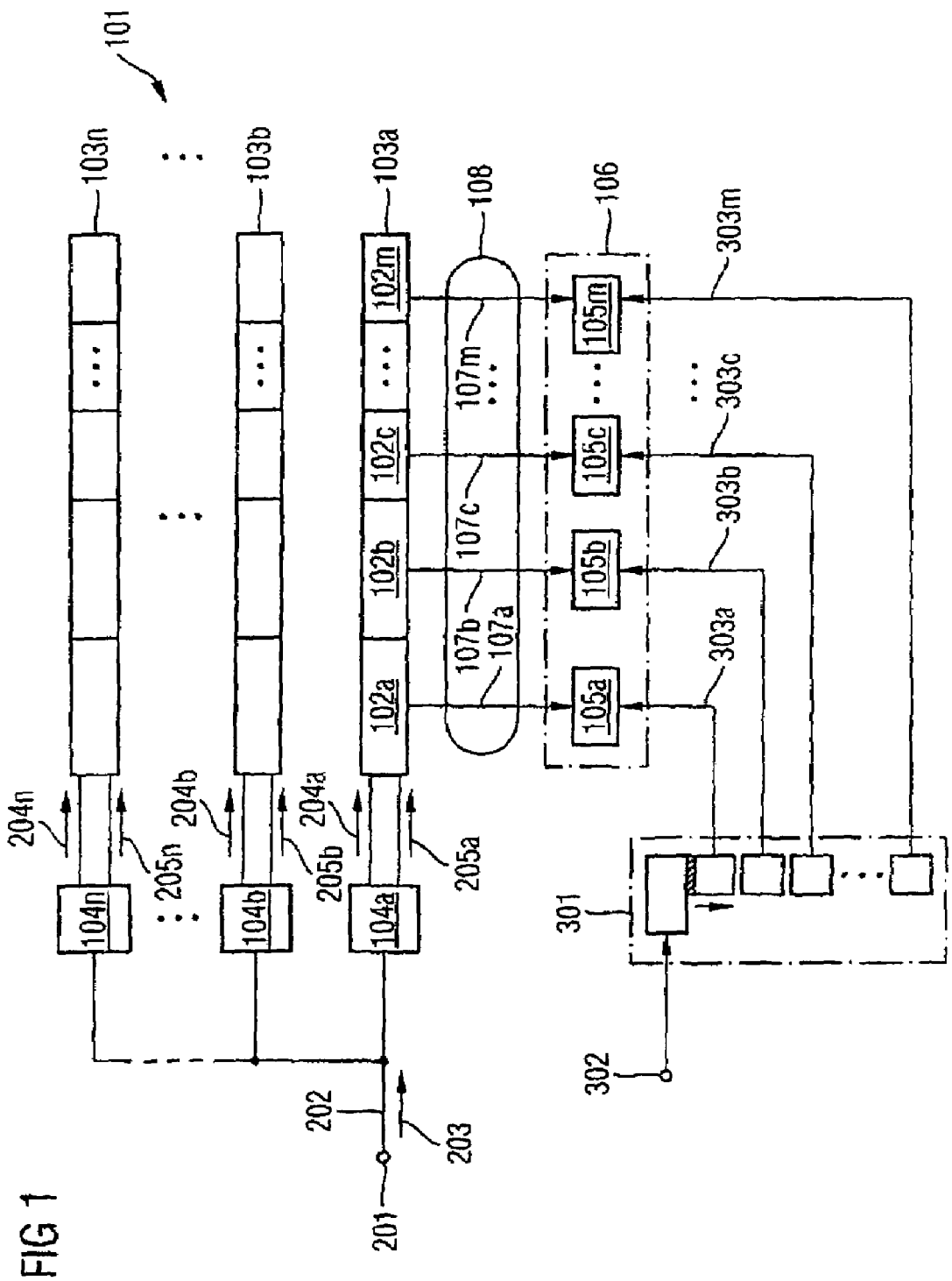
FIG. 1 shows a test apparatus in a circuit unit to be tested as a block diagram, in accordance with a preferred exemplary embodiment of the present invention.

FIG. 1 shows a test apparatus for testing a circuit unit 101 to be tested in accordance with a preferred exemplary embodiment of the present invention. In the circuit unit 101 to be tested, a data memory bank 106 has a number m of data memory units 105a-105m. Data memory units 105a-105m of this type comprise registers YA, YB, XWR and XRD, by way of example. It should be pointed out that the test apparatus according to the invention is designed for an arbitrary number m of data memory units 105a-105m.

The circuit components for carrying out the method according to the invention are illustrated above the data memory bank 106 in FIG. 1. The circuit components illustrated by the reference symbols 301, 302 and 303a-303n correspond to a conventional test arrangement for testing the circuit unit 101 to be tested.

In this case, a reference symbol 301 designates a serial test mode data input device for inputting test mode data via a serial address control terminal 302. In the serial test mode data input device 301, the test mode data are fed serially via serial transfer lines 303a-303m to the data memory units 105a-105m of the data memory bank 106.

It should be pointed out that the number of serial transfer lines 303a-303m preferably corresponds to the number m of data memory units 105a-105m provided in the data memory bank 106. By means of the serial test mode data input device 301, it is possible to load test data sets into the data memory units 105a-105m in a serial manner.

In order to reduce a test time and thus in order to reduce test costs, use is made of the method according to the invention, which can be carried out with the circuit components illustrated in the upper part of FIG. 1.

In order to carry out the method according to the invention, at least two register banks 103a-103n are provided in the circuit unit 101 to be tested. Different test mode data sets can be stored in the register banks 103a-103n, as will be described in more detail below. If different test topologies based on at least two different test mode data sets are to be applied to the circuit unit to be tested, then it is possible to obtain an advantage when testing a circuit unit 101 to be tested in accordance with the method according to the invention already when using two register banks 103a, 103b.

It should be pointed out that the method according to the invention can be carried out with an arbitrary number n of register banks 103a-103n, provided that the circuit unit 101 to be tested makes such a number of register banks available. Preferably, each register bank 103a-103n has in each case a number m of register units 102a-102m, the number m corresponding to the number m of data memory units 105a-105m of the data memory bank 106.

The register banks 103a-103n are connected to the data memory bank 106 via a transfer device 108. More specifically, the transfer device 108 has a number m of transfer lines 107a-107m, the number m of transfer lines corresponding to the number m of register units 102a-102m of the register bank 103a-103n, on the one hand, and to the number of data memory units 105a-105m of the data memory bank 106, on the other hand.

The invention involves the feeding of test mode data sets 204a-204n and a corresponding addressing signal 203 via an address control terminal 201 from the test apparatus. In this case, an address control line 202 is connected to an input terminal of test mode data banks 104a-104n. The test mode data banks 104a-104n are preferably provided in a number n corresponding to the number of register banks 103a-103n, namely in a number n. The test mode banks 104a-104n provide at least one test mode data set 204a-204n and at least one activation signal 205a-205n from the addressing and test signals fed to them.

The test mode data set 204a-204n and the activation signal 205a-205n are fed to the corresponding register bank 103a-103n, in accordance with the numbering "a" to "n".

It should be pointed out that the lower case letters succeeding the reference symbols in each case relate to signals or a test mode bank of a specific register bank.

By means of the test apparatus according to the invention, it is now possible to load test mode data sets 204a-204n into corresponding register banks 103a-103n beforehand, in such a way that different test topologies that can be defined beforehand can be incremented. An activation of a corresponding register bank 103a-103n and a transfer of its data content are effected in a manner dependent on the corresponding activation signal 205a-205n.

If one of the register banks 103a-103n is fed an activation signal 205a-205n, then contents of all the register units 102a-102m of the relevant register bank 103a-103n are transferred to the corresponding data memory units 105a-105m of the data memory bank 105. It should be pointed out that such a transfer of data is effected in a parallel manner, in such a way that a test sequence (test pattern sequence) is not interrupted.

Each of the register banks 103a-103n is addressed by means of two different test modes, i.e.
(i) a definition of the content of the register units 102a-102m of the relevant register bank 103a-103n; and
(ii) a transfer of the contents of the register units 102a-102m of the relevant register bank 103a-103n to the data memory units 105a-105m of the data memory bank 106 via the transfer lines 107a-107m of the transfer device 108.

The test apparatus according to the invention and the associated test method achieve the advantage, in particular, that the data memory units 105a-105m can be supplied with a corresponding test mode data set 204a-204n in a simple manner, in parallel and at high speed with contents of register units 102a-102m of an activated register bank 103a-103n.

In this way, a test time is reduced without having to reduce a number of circuit units to be tested in parallel. This leads to an increase in the throughput rate when testing circuit units to be tested, in such a way that test costs are expediently lowered.

Figure 2:
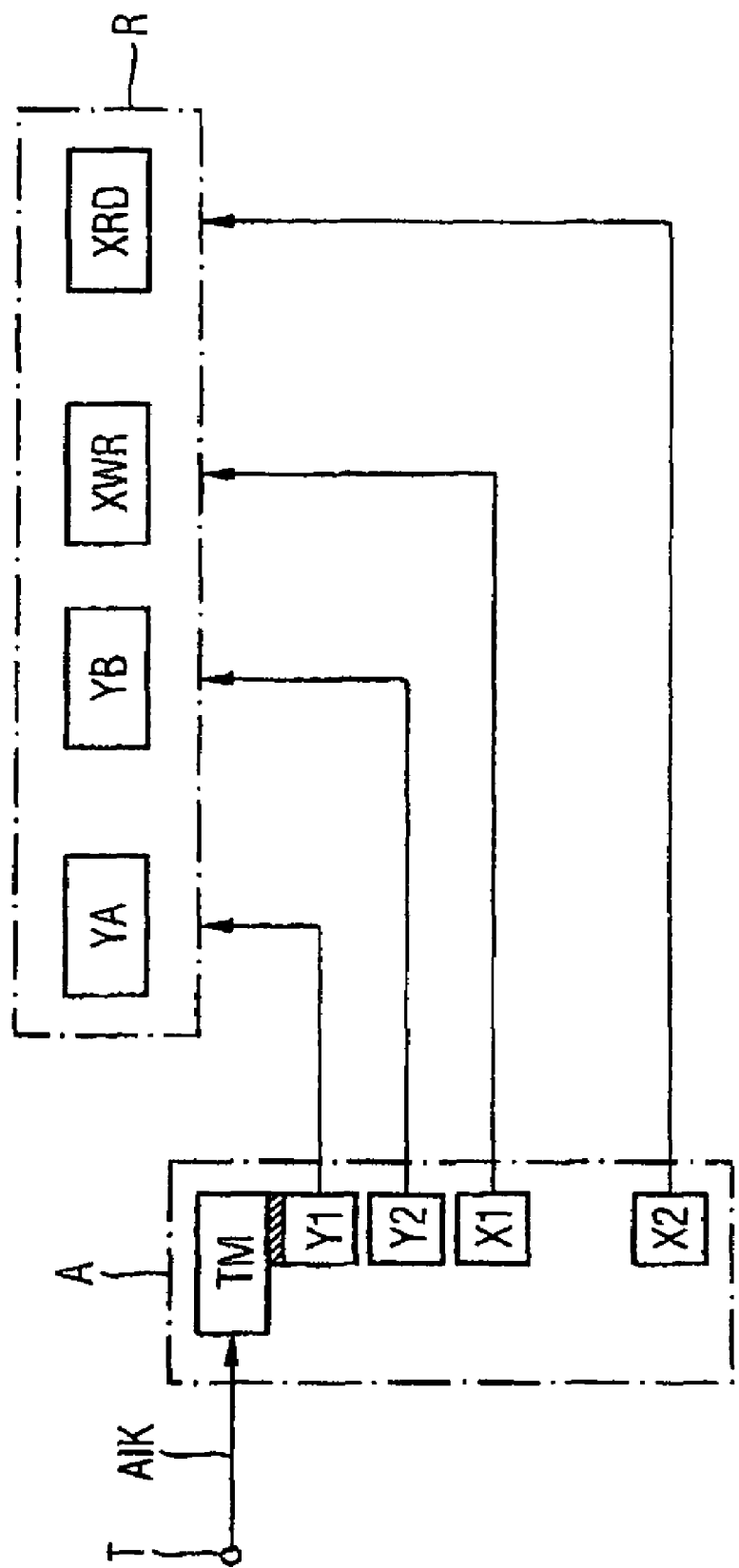
FIG. 2 shows a test apparatus in a circuit unit to be tested according to the prior art.

With regard to the conventional test apparatus for testing circuit units to be tested as illustrated in FIG. 2, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

The invention claimed is:

1. A circuit unit having a test mode, the circuit unit comprising:
a plurality of data memory units;
an address control terminal being configured to to receive test mode data;
at least one test mode data bank being connected to the address control terminal to receive the test mode data, the at least one test mode data bank for generating a test mode data set and an activation signal;
at least one register bank being configured to receive the generated test mode data set and the activation signal, the at least one register bank for outputting the received test mode data set in response to the received activation signal; and
a transfer device being configured to receive the outputted test mode data set, the transfer device further being configured to transfer the outputted test mode data set to the plurality of memory units.

2. The circuit unit of claim 1, wherein:
the at least one register bank comprises a plurality of register units, the number of the plurality of register units corresponding to the number of the plurality of data memory units.

3. The circuit unit of claim 2, wherein:
the transfer device comprises a plurality of transfer lines, each of the plurality of transfer lines corresponding to one of the plurality of register units, each of the plurality of transfer lines being connected to the corresponding one of the plurality of register units.

4. The circuit unit of claim 3, wherein:
each of the plurality of transfer lines further corresponds to one of the plurality of data memory units, each of the plurality of transfer lines being connected to the corresponding one of the plurality of data memory units.

5. The circuit unit of claim 1, wherein:
the transfer device comprises a plurality of transfer lines, each of the plurality of transfer lines corresponding to one of the plurality of data memory units, each of the plurality of transfer lines being connected to the corresponding one of the plurality of data memory units.

6. The circuit unit of claim 1, wherein:
the at least one register bank comprises a plurality of register banks; and
the at least one test mode data bank comprises a plurality of test mode data banks, each of the plurality of test mode data banks being connected to one of plurality of register banks.

7. The circuit of claim 6, wherein:
each of the plurality of register banks comprises a plurality of register units, the number of the plurality of register units in each of the plurality of register banks corresponding to the number of the plurality of data memory units.

8. The circuit unit of claim 7, wherein:
the transfer device comprises a plurality of transfer lines, each of the plurality of transfer lines corresponding to one of the plurality of register units in each one of the plurality of register banks, each of the plurality of transfer lines being connected to the corresponding one of the plurality of register units in each of the plurality of register banks.

9. The circuit unit of claim 8, wherein:
each of the plurality of transfer lines further corresponds to one of the plurality of data memory units, each of the plurality of transfer lines being connected to the corresponding one of the plurality of data memory units.

10. A method of testing a circuit unit comprising:
a) receiving test mode data through an address control terminal of the circuit unit;
b) generating with at least one test mode data bank at least one test mode data set and at least one activation signal;
c) receiving at an at least one register bank the at least one test mode data set and the at least one activation signal;
d) transferring through a transfer device the at least one test mode data set received by the at least one register bank to a data memory bank in response to the at least one activation signal; and
e) storing the transferred at least one test mode data set in the data memory bank.

11. The method of claim 10, wherein:
step d) comprises transferring in parallel the at least one test mode data set received by the at least one register bank to a plurality of data memory units in the data memory bank in response to the at least one activation signal.

12. The method of claim 10, wherein:
step d) comprises transferring through the transfer device the at least one test mode data set received by the at least one register bank from a plurality of register units in the at least one register bank to a plurality of data memory units in the data memory bank in response to the at least one activation signal.

13. A test configuration within a circuit unit having a plurality of data memory units comprising:
an address control terminal for receiving test mode data;
a first test mode data bank being configured to receive the test mode data, the first test mode data bank for generating a first test mode data set and a first activation signal based upon the received test mode data;
a second test mode data bank being configured to receive the test mode data, the second test mode data bank for generating a second test mode data set and a second activation signal based upon the received test mode data;
a first register bank being configured to receive the generated first test mode data set and the first activation signal, the first register bank for outputting the received first test mode data set in response to the received first activation signal;
a second register bank being configured to receive the generated second test mode data set and the second activation signal, the second register bank for outputting the received second test mode data set in response to the received second activation signal; and
a transfer device being configured to receive the outputted first test mode data set and further being connected to the second register bank to receive the outputted second test mode data set, the transfer device further being configured to transfer the outputted first test mode data set and the outputted second test mode data set to the plurality of memory units.

14. The configuration of claim 13, wherein:
the first register bank and the second register bank each comprise a plurality of register units, each of the plurality of register units in the first register bank and each of the plurality of register units in the second register bank corresponding to one of the plurality of data memory units.

15. The configuration of claim 14, wherein:
the transfer device comprises a plurality of parallel transfer lines; each of the plurality of parallel transfer lines is configured for one of the plurality of register units of the first register bank and the one of the plurality of data memory units corresponding to the one of the plurality of register units; and
each of the plurality of transfer lines is further configured for one of the plurality of register units of the second register bank and the one of the plurality of data memory units corresponding to the one of the plurality of register units.

16. The configuration of claim 15, further comprising:
a third test mode data bank being configured to receive the test mode data, the third test mode data bank for generating a third test mode data set and a third activation signal based upon the received test mode data; and
a third register bank being configured to receive the generated third test mode data set and the third activation signal, the third register bank for outputting the received third test mode data set in response to the received third activation signal, and wherein,
the transfer device is further being configured to receive the outputted third test mode data set and transfer the outputted third test mode data set to the plurality of memory units.

17. The configuration of claim 16, wherein the third register bank comprises a plurality of register units, each of the plurality of register units in the third register bank corresponding to one of the plurality of data memory units.

18. The configuration of claim 17, wherein:
each of the plurality of parallel transfer lines of the transfer device is configured for one of the plurality of register units of the third register bank and the one of the plurality of data memory units corresponding to the one of the plurality of register units.

19. The configuration of claim 13, further comprising:
a third test mode data bank being configured to receive the test mode data, the third test mode data bank for generating a third test mode data set and a third activation signal based upon the received test mode data; and
a third register bank being configured to receive the generated third test mode data set and the third activation signal, the third register bank for outputting the received third test mode data set in response to the received third activation signal, and wherein,
the transfer device is further being configured to receive the outputted third test mode data set and transfer the outputted third test mode data set to the plurality of memory units.

* * * * *